(12) United States Patent
Maltabes et al.

(10) Patent No.: US 6,486,049 B2
(45) Date of Patent: Nov. 26, 2002

(54) METHOD OF FABRICATING SEMICONDUCTOR DEVICES WITH CONTACT STUDS FORMED WITHOUT MAJOR POLISHING DEFECTS

(75) Inventors: John Maltabes, Austin, TX (US); Hans Zeindl, Dresden (DE)

(73) Assignees: Motorola, Inc., Schaumburg, IL (US); Semiconductor 300 GmbH & Co. KG, Dresden (DE); Infineon Technologies AG, Munich (DE)

( * ) Notice: Subject to any disclaimer, the term of this patent is extended or adjusted under 35 U.S.C. 154(b) by 0 days.

(21) Appl. No.: 09/845,600

(22) Filed: Apr. 30, 2001

(65) Prior Publication Data

US 2002/0158340 A1 Oct. 31, 2002

(51) Int. Cl.$^7$ ............................................. H01L 21/283
(52) U.S. Cl. ....................................... 438/597; 438/690
(58) Field of Search ................................ 438/629, 597, 438/612, 613, 626, 637, 669, 672, 690, 691, 694

(56) References Cited

U.S. PATENT DOCUMENTS

| | | | | |
|---|---|---|---|---|
| 5,354,712 A | * | 10/1994 | Ho et al. | ..................... 438/643 |
| 5,575,885 A | * | 11/1996 | Hirabayashi et al. | ......... 216/38 |
| 5,925,501 A | * | 7/1999 | Zhang et al. | ................. 134/1.2 |

* cited by examiner

Primary Examiner—Richard Elms
Assistant Examiner—Beth E. Owens
(74) Attorney, Agent, or Firm—James L. Clingan, Jr.

(57) ABSTRACT

In a semiconductor device, a contact stud (100) contacts a semiconductor substrate (10); the stud is embedded in an insulating structure with a first insulating layer (20) and a second insulating layer (20'). During manufacturing, (a) the first layer (20) is provided above the substrate (10); (b) a hole in the first layer (20) exposes a portion of the upper surface of the substrate to receive the stud; (c) a contact material (30, 40) is provided at the top of the resulting structure; (d) a first chemical-mechanical polishing (CMP) removes the contact material from the surface of the first layer (20) outside the hole; (e) residuals (50) of the contact material are cleaned away from the upper surface; (f) the second insulating layer (20') is provided at the surface of the resulting structure; (g) and further polishing is applied.

8 Claims, 2 Drawing Sheets

METHOD OF FABRICATING SEMICONDUCTOR DEVICES WITH CONTACT STUDS FORMED WITHOUT MAJOR POLISHING DEFECTS

FIELD OF THE INVENTION

The present invention generally relates to a method for providing a semiconductor device including contact studs for contacting a semiconductor substrate, said contact studs being embedded in an insulating structure. The present invention also relates to a corresponding semiconductor device.

BACKGROUND OF THE INVENTION

Hereinbelow, the technical term semiconductor substrate is used in a general sense, i.e. said substrate may be a wafer substrate, a wafer substrate carrying an integrated circuit, a multi-wafer substrate and so on.

FIGS. 1 and 2 are schematic illustrations of process steps of a known method for providing a semiconductor device including contact studs for contacting a semiconductor substrate, said contact studs being embedded in an insulating structure.

In FIG. 1, reference sign 10 denotes a semiconductor substrate carrying an integrated circuit, which is not shown in detail here. Although not limited thereto, in this example, the semiconductor substrate 10 is a silicon substrate. Reference sign 20 denotes an oxide layer having holes, wherein contact studs are to be formed. To form said contact studs, in a first step a liner layer 30 made of titanium is deposited in a conformal deposition process. In a second step, on said liner layer 30 a metal layer 40 made of tungsten is deposited such that it covers the whole structure which results in the status shown in FIG. 1.

As may be seen from FIG. 2, in a third step a metal polish is performed by a chemical-mechanical polishing step CMP1 in order to remove the tungsten layer 40 and the titanium layer 30 from the upper surface of the insulating oxide layer 20 such that said contact studs 100 are formed. During said metal polishing, the upper surface of said oxide layer 20 incurs micro-scratching effects leaving micro-scratches 60 on said upper surface. Moreover, liner residuals 50 may be left on said upper surface and/or in said micro-scratches 60 of said oxide layer 20. In addition, if the metal polishing step is performed too long, the contact studs can protrude too far up and cause metal openings on subsequent layers, as indicated in FIG. 2. Also, there may be a loss or distortion of oxide defined features such as overlay and alignment marks.

The liner residuals 50 and the subsequently performed metal position in the micro-scratches 60 can cause shorts when they go untreated. In addition, there can also be an area where residuals 50 from subsequent processing steps, either wet or dry, can be a source of additional defects or contamination.

The present invention seeks to provide a method for providing a semiconductor device including contact studs for contacting a semiconductor substrate, said contact studs being embedded in an insulating structure, which mitigate or avoid these and other disadvantages and limitations of the prior art.

DETAILED DESCRIPTION OF A PREFERRED EMBODIMENT

Figure 1:
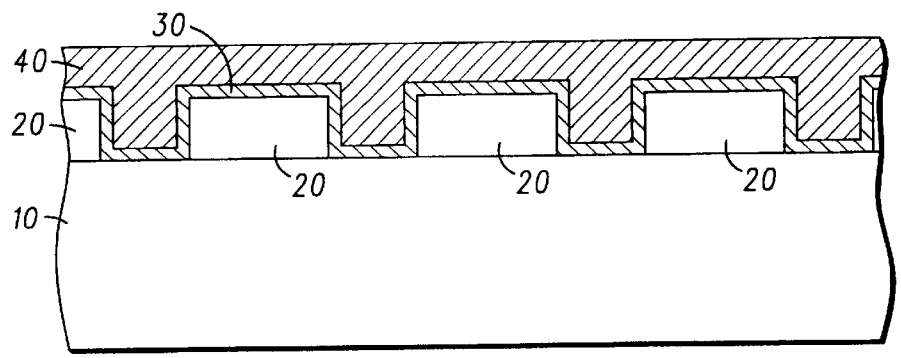
FIGS. 1 and 2 are schematic illustrations of process steps of a known method for providing a semiconductor device including contact studs for contacting a semiconductor substrate, said contact studs being embedded in an insulating structure.

In accordance with one aspect of the present invention, there is provided a method for providing a semiconductor device including contact studs for contacting a semiconductor substrate, said contact studs being embedded in an insulating structure, said method comprising the steps of providing said semiconductor substrate; providing a first insulating layer on said semiconductor substrate; forming holes in the first insulating layer for exposing parts of the upper surface of the semiconductor substrate where said contact studs are to be formed; providing a contact material on the resulting structure; performing a first polishing step for removing said contact material from the upper surface of said first insulating layer such that said contact studs are formed; performing a cleaning step for removing residuals of said contact material from the upper surface of said first insulating layer; providing a second insulating layer on the resulting structure; and performing a second polishing step for exposing the upper surface of said contact studs.

In accordance with another aspect of the present invention, there is provided a semiconductor device including contact studs for contacting a semiconductor substrate, said contact studs being embedded in an insulating structure, said device comprising a first insulating layer on said semiconductor substrate; a second insulating layer on said first insulating layer; and holes in said first and second insulating layer where said contact studs are formed such that the upper surface of the second insulating layer is essentially flush (i.e. coplanar) with the upper surface of said contact studs.

The general idea underlying the present invention is to add to the conventional process a cleaning step for removing residuals of the contact stud material from the upper surface of the first insulating layer, a second insulating material deposition step, and a second polishing step for making flush the upper surface of the insulating material deposited in the second deposition step and the upper surface of the contact studs. Thus, the present invention allows to preserve all the previous oxide defined features, and to avoid protruding metal studs.

According to a preferred embodiment, said contact material comprises a lower first layer consisting of a first conducting material and an upper second layer consisting of a second conducting material.

According to another preferred embodiment, said first layer is a liner.

According to another preferred embodiment, said a first conducting material comprises titanium and said second conducting material comprises tungsten.

According to another preferred embodiment, said first and second insulating layers are oxide layers.

According to another preferred embodiment, said cleaning step is a plasma flash step.

According to another preferred embodiment, said first polishing step is a chemical mechanical polishing step.

According to another preferred embodiment, said second polishing step is a chemical mechanical polishing step.

Throughout the figures, the same reference signs denote the same or equivalent parts.

In a semiconductor device, a contact stud (100) contacts a semiconductor substrate (10); the stud is embedded in an insulating structure with a first insulating layer (20) and a second insulating layer (20'). During manufacturing, (a) the first layer (20) is provided above the substrate (10); (b) a hole in the first layer exposes a portion of the upper surface of the substrate to receive the stud; (c) a contact material (30, 40) is provided at the top of the resulating structure; (d) a first chemical-mechanical polishing (CMP) removes the contact material from the surface of the first layer outside the hole; (e) residuals (50) of the contact material are cleaned away from the upper surface; (f) the second insulating layer (20') is provided at the surface of the resulting structure; (g) and further polishing is applied.

Figure 3:
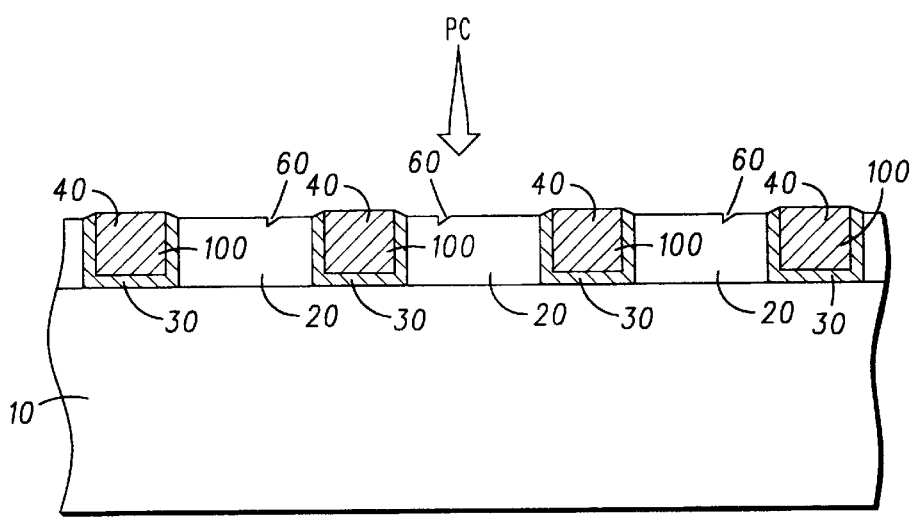
FIG. 3 is a schematic illustration of a plasma process step according to a preferred embodiment of the present invention.

FIG. 3 is a schematic illustration of a plasma process step according to a preferred embodiment of the present invention.

Figure 5:
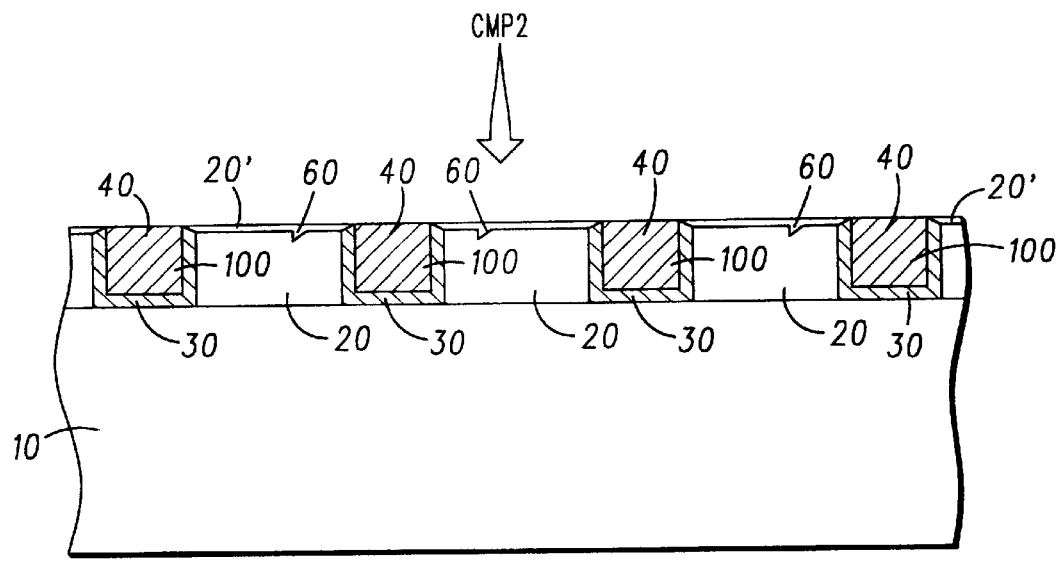
FIG. 5 is a schematic illustration of a chemical mechanical polishing step according to said preferred embodiment of the present invention.

The process step illustrated in FIG. 3 is immediately performed after the status of the conventional process shown in FIG. 5. Since the conventional process up to this status was already explained above, a repeated description thereof will be omitted.

Figure 2:
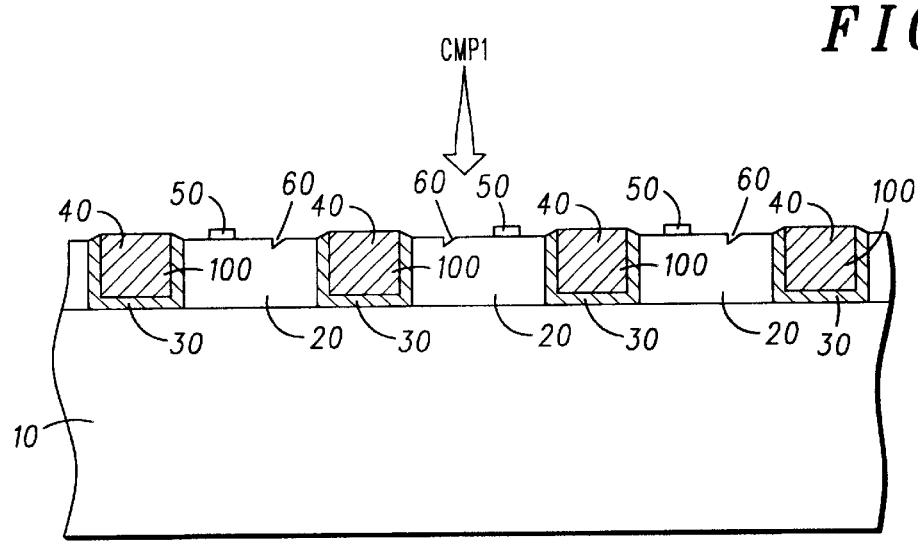

According to FIG. 3, after the process status of FIG. 2, a cleaning step PC in form of a plasma flash cleaning step is performed to remove the residuals 50 of the liner layer 30 from the upper surface of the oxide layer 20. This plasma flash cleaning is preferably a dry cleaning step which is selective to the tungsten of the layer 40 and only removes the titanium liner residuals 50 (cf. FIG. 2) of the titanium liner layer 30 from the upper surface of the oxide layer 20. As shown in FIG. 1, the micro-scratches 60 are still present on the oxide layer 20 after said plasma flash cleaning step.

Figure 4:
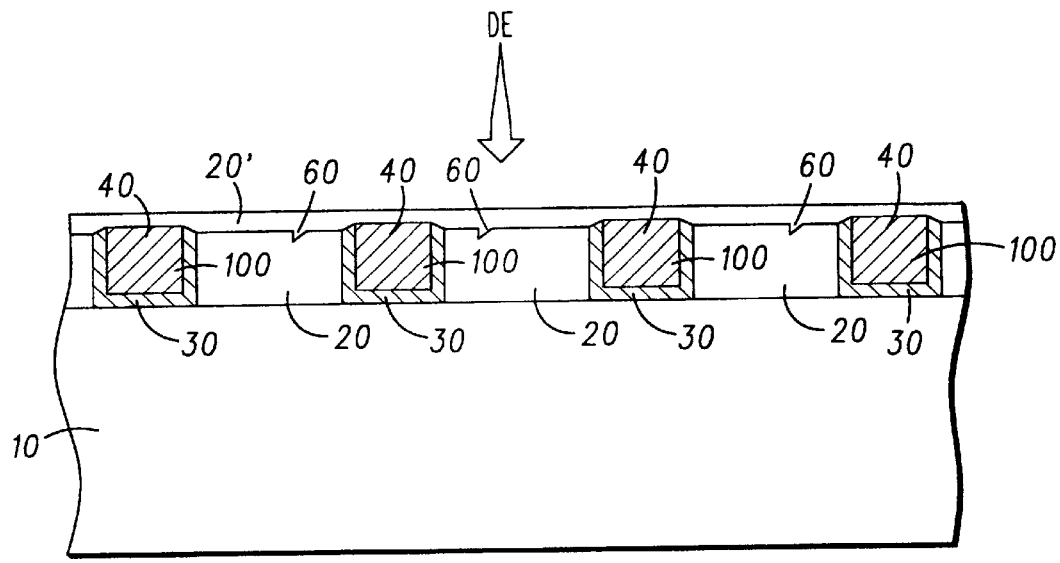
FIG. 4 is a schematic illustration of an insulating material deposition step according to said preferred embodiment of the present invention.

FIG. 4 is a schematic illustration of an insulating material deposition step according to said preferred embodiment of the present invention.

As shown in FIG. 4, in a next process step, a relatively thin second oxide layer 20' is deposited on the resulting structure. Relatively thin in this respect means that the second oxide layer 20' is thinner than the first oxide layer 20 and the height of the contact studs 100. This deposition step results in the status shown in FIG. 4.

FIG. 5 is a schematic illustration of a chemical mechanical polishing step according to said preferred embodiment of the present invention.

In a next and final process step as illustrated in FIG. 5, a second chemical-mechanical polishing step CMP2 is performed in order to bring the second oxide layer 20' level planar or flush with the upper surface of the contact studs 100. In this chemical-mechanical polishing step, the slurry may be changed in comparison to the first chemical-mechanical polishing step CMP1, because only oxide of the oxide layer 20' has to be removed, and no liner residuals. As a consequence, it is relatively easy to avoid that the contact studs 100 protrude from the resulting upper surface of the second oxide layer 20' after the second chemical-mechanical polishing step CMP2.

While the invention has been described in terms of particular structures, devices and methods, those of skill in the art will understand based on the description herein that it is not limited merely to such examples and that the full scope of the invention is properly determined by the claims that follow.

Particularly, the invention is not limited to the special insulating and contact materials or to the silicon substrate. Moreover, the polishing step is not limited to a chemical mechanical polishing step.

What is claimed is:

1. A method for providing a semiconductor device including contact studs for contacting a semiconductor substrate, said contact studs being embedded in an insulating structure, said method comprising the steps of:

providing said semiconductor substrate;

providing a first insulating layer on said semiconductor substrate;

forming holes in the first insulating layer for exposing parts of the upper surface of the semiconductor substrate where said contact studs are to be formed;

providing a contact material on the resulting structure;

performing a first polishing step for removing said contact material from the upper surface of said first insulating layer such that said contact studs are formed;

performing a cleaning step for removing residuals of said contact material from the upper surface of said first insulating layer;

providing a second insulating layer on the resulting structure; and performing a second polishing step for exposing the upper surface of said contact studs.

2. The method according to claim 1, wherein said contact material comprises a lower first layer consisting of a first conducting material and an upper second layer consisting of a second conducting material.

3. The method according to claim 2, wherein said lower first layer is a liner.

4. The method according to claim 2, wherein said first conducting material comprises titanium and said second conducting material comprises tungsten.

5. The method according to claim 1, wherein said first and second insulating layers are oxide layers.

6. The method according to claim 1, wherein said cleaning step is a plasma flash step.

7. The method according to claim 1, wherein said first polishing step is a chemical mechanical polishing step.

8. The method according to claim 1, wherein said second polishing step is a chemical mechanical polishing step.

* * * * *